(12) United States Patent
So et al.

(10) Patent No.: US 10,917,310 B2
(45) Date of Patent: Feb. 9, 2021

(54) MODELING DISTRIBUTION OF DIGITAL COMPONENTS OVER A NETWORK

(71) Applicant: Google LLC, Mountain View, CA (US)

(72) Inventors: Chiu Wah Kelvin So, Mountain View, CA (US); Jakub Ocwieja, Zurich (CH); Radu Jurca, Kilchberg (CH); Md Mahbubul Hasan, Oberrieden (CH); Daniel Svonava, Lachen (CH); Mahesh Keralapura Manjunatha, Fremont, CA (US); David Fan, San Francisco, CA (US); Yao Liu, Sunnyvale, CA (US); Xi Xiong, San Jose, CA (US); Andrei Dragus, San Francisco, CA (US); Vinay Vyas Vemuri, San Jose, CA (US); Shen Wang, Sunnyvale, CA (US); Muruo Liu, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/666,658

(22) Filed: Oct. 29, 2019

(65) Prior Publication Data
US 2020/0313976 A1 Oct. 1, 2020

Related U.S. Application Data

(63) Continuation of application No. PCT/US2019/025176, filed on Apr. 1, 2019.

(51) Int. Cl.
*H04N 21/466* (2011.01)
*H04L 12/24* (2006.01)
(Continued)

(52) U.S. Cl.
CPC .......... *H04L 41/145* (2013.01); *G06F 16/953* (2019.01); *G06F 30/20* (2020.01); *H04L 43/08* (2013.01)

(58) Field of Classification Search
CPC ....... H04L 41/145; H04L 43/08; G06F 30/20; G06F 16/953
See application file for complete search history.

(56) References Cited

U.S. PATENT DOCUMENTS

| 9,449,052 B1 | 9/2016 | Rivard et al. |
| 2008/0263578 A1 | 10/2008 | Bayer et al. |
| (Continued) | | |

OTHER PUBLICATIONS

PCT International Search Report and Written Opinion in International Application No. PCT/US2019/025176, dated Nov. 5, 2019, 14 pages.

*Primary Examiner* — Philip J Chea
*Assistant Examiner* — Wuji Chen
(74) *Attorney, Agent, or Firm* — Fish & Richardson P.C.

(57) ABSTRACT

Methods, systems, and apparatus, including computer programs encoded on a computer storage medium, for a content platform that receives a request to provide a digital component. The request includes information about users to which the digital component is directed. Futurized queries are obtained from serving logs of a serving system that is configured to execute an existing digital component using serving code that directs digital content to the set of users. The futurized queries are loaded as data structures in memory of a forecasting system. The system uses an instruction set derived from the serving code to determine that similarity between the particular futurized query and the request exceeds a threshold similarity. The system then generates a forecast output as a response to the request based on futurized queries that exceed the threshold similarity. The forecast output includes data describing future provision of the digital component.

23 Claims, 5 Drawing Sheets

(51) Int. Cl.
*G06F 16/953* (2019.01)
*G06F 30/20* (2020.01)
*H04L 12/26* (2006.01)

(56) References Cited

U.S. PATENT DOCUMENTS

| | | |
|---|---|---|
| 2010/0114647 A1 | 5/2010 | Chu et al. |
| 2010/0293047 A1 | 11/2010 | Schwarz et al. |
| 2011/0029376 A1 | 2/2011 | Mills et al. |
| 2011/0029377 A1 | 2/2011 | Chen et al. |
| 2011/0270676 A1 | 11/2011 | Vassilvitskii et al. |
| 2012/0157456 A1 | 6/2012 | Wang et al. |
| 2013/0339126 A1 | 12/2013 | Cui et al. |
| 2014/0058793 A1 | 2/2014 | Nath et al. |
| 2016/0210655 A1 | 7/2016 | Cottle et al. |
| 2018/0032521 A1 | 2/2018 | Boerschinger et al. |

MODELING DISTRIBUTION OF DIGITAL COMPONENTS OVER A NETWORK

CROSS-REFERENCE TO RELATED APPLICATION

This application is a continuation of International Application No. PCT/US2019/025176, filed Apr. 1, 2019, the contents of which are incorporated by reference herein.

BACKGROUND

This specification relates to modeling traffic sent over a communications network.

The Internet facilitates the exchange of information between users across the globe. This exchange of information enables distribution of content to a variety of users. In some situations, content from multiple different providers can be integrated into a single electronic document to create a composite document. For example, a portion of the content included in the electronic document may be selected (or specified) by a publisher of the electronic document. A different portion of content (e.g., digital component) can be provided by a third-party (e.g., an entity that is not a publisher of the electronic document and/or does not have access to modify code defining the electronic document).

In some situations, however, the digital component is selected for integration with the electronic document only after presentation of the electronic document has been requested and/or while the electronic document is being rendered. For example, machine executable instructions included in the electronic document can be executed by a client device when the electronic document is rendered at the client device. The executable instructions can enable the client device to contact one or more remote servers to obtain a digital component that will be integrated into the electronic document while presented at the client device. Given the dynamic and global nature of the Internet, it is difficult to model and forecast the way in which digital components will be provided to users over time. The present application is concerned with modeling traffic on computer networks (such as the Internet) to allow for modeling and prediction of the way in which digital components will be distributed over those networks.

SUMMARY

This document describes techniques for improved forecasting of the distribution of digital components that may be provided over a network as a response to an electronic request for certain types of content.

The electronic request can be received from a user/client device that interacts with content of a publisher page that is displayed or rendered on the client device. In some cases, the request can be received from a publisher server that hosts the publisher page. A content provider may submit specialized content (e.g., digital components) to a content platform as a candidate for use in responding to the request. The content platform can be configured to manage use and selection of specialized content as responses to requests for such content.

Based on the described techniques, a forecasting system of the content platform forecasts distribution of digital components and generates an output that indicates a quantity of users to which the digital components will be directed by a serving system of the content platform. For example, the forecasting system forecasts performance by using computing logic of a retrieval library that is a substantial or exact match to computing logic executed in the serving system of the content platform. The forecasting system holds a futurized set of user queries in memory and processes information in the queries against parameters, e.g., targeting and filtering requirements, of an incoming request from a content provider to distribute one or more digital components. The forecasting system can determine information in a set of futurized user queries that is similar to, or matches, the parameters of the incoming requests from content providers. The forecasting system generates the output using the information for these similar or matching futurized queries.

The described techniques include configuring program code ("serving code") executed at the serving system such that the serving code can be efficiently re-used and implemented at the forecasting system to perform accurate impression forecasting. For example, the serving code is uniquely organized to enable the overall computing logic of the serving code to be maintained as a retrieval library so that the serving representation of a digital campaign and corresponding retrieval library is easily reversible for effective implementation at the forecasting system. Requests from a content provider to distribute one or more digital components may be referred to herein as a digital campaign. A digital campaign may comprise one or more digital components and one or more parameters (e.g. targeting and filtering requirements).

Using these techniques, the serving code can be organized or structured to have fewer (e.g., substantially fewer) global structures, relative to conventional methods. The serving code also does not require reverse-indexes that are built over existing digital campaigns, which can preclude effective re-use and implementation of the code by the forecasting system. Also, a per-campaign data structure is configured to be the same between the serving and forecasting systems. This allows campaign data structures to be easily reused at the forecasting system to construct a per forecast-request campaign representation, thereby reducing developer burden and enabling the forecasting system to benefit from developments and improvements that are made to the serving system.

In one example implementation described herein, a computer-implemented method comprises receiving a request to provide a digital component to a set of users, wherein the request includes information about the set of users to which the digital components is directed. The method obtains, based on the received request, a plurality of futurized queries from historical serving logs of a serving system that is configured to serve an existing digital component using serving code that directs the existing digital component to the set of users. For each futurized query of the plurality of futurized queries, the method includes: loading the futurized query as a data structure in a memory of the forecasting system; determining, by a forecasting system, a measure of similarity between the request and at least the futurized query based on an instruction set of the forecasting system that is derived from the serving code; and determining, for a particular futurized query, that the measure of similarity indicates similarity between the particular futurized query and the request exceeds a threshold similarity. The method generates, by the forecasting system and based on the particular futurized query, a forecast output as a response to the request, wherein the forecast output includes data describing future serving of the digital component, and determines a quantity of users to which the digital component will be directed by the serving system.

Determining a quantity of users to which the digital component will be directed may, in some implementations, comprise determining the quantity of users to which the digital component will be directed based on a quantity of particular futurized queries for which a respective measure of similarity indicates similarity between each of the particular futurized queries and the request exceeds a threshold similarity.

Serving code of the serving system may include a set of pre-defined reversible data structures. The instruction set of the forecasting system may be derived using the set of pre-defined reversible data structures included in the serving code of the serving system. The method may also further comprise filtering the plurality of futurized queries against information about the set of users in the request. The plurality of futurized queries may be filtered using a filtering logic in the instruction set of the forecasting system. The filtering logic may be derived from the set of pre-defined reversible data structures. A targeting representation of the digital component may be generated in response to processing information about the set of users in the request against the plurality of futurized queries. The targeting representation may be generated using a targeting logic in the instruction set of the forecasting system, the targeting logic being derived from the set of pre-defined reversible data structures. The targeting representation of the digital component may comprise information describing a demographic attribute of the quantity of users, geographic region that includes the quantity of users, and/or a timeframe for distributing the digital component. The targeting representation of the digital component may comprise an eligibility value that controls transmission of the digital component. The set of pre-defined reversible data structures may be configured to provide filtering functions of the serving system. The filtering logic of the forecasting system may be configured to emulate, at the forecasting system, filtering functions performed by the serving system when the serving system serves the digital component. The set of pre-defined reversible data structures may be configured to provide targeting functions of the serving system. The targeting logic of the forecasting system may be configured to emulate, at the forecasting system, targeting functions performed by the serving system when the serving system serves the digital component.

The forecasting system may generate a respective similarity score based on the determined measure of similarity for each futurized query. The respective similarity score may be generated for each futurized query obtained from the historical serving logs. The respective similarity score may indicate a match between a plurality of first parameters of the request and a plurality of second parameters of the particular futurized query obtained from the historical serving logs.

Other implementations of this and other aspects include corresponding systems, apparatus, and computer programs, configured to perform the actions of the methods, encoded on computer storage devices. A computing system of one or more computers or hardware circuits can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The subject matter described in this specification can be implemented in particular implementations and can result in one or more of the following advantages. The techniques provide an advantage in which there is no skew in logic used to serve a digital campaign as a response to a request or to forecast future performance of a digital campaign that can be served as a response to the request. For example, the same logic and data structures can be used to serve digital components or other content of a digital campaign as well as to forecast performance of the digital campaign.

The techniques include organizing and structuring the serving code of a serving system in a manner that enables efficient reuse at a forecasting system. The forecasting system can be configured to forecast estimated reach of a digital campaign by efficiently emulating functions for serving the campaign. This method of forecasting reach of digital campaign provides a more accurate indication of how a campaign will be distributed over the network when executed by the serving system. This enables a content platform to forecast the distribution of a particular digital campaign with improved accuracy relative to conventional methods. Further, the platform accurately forecasts the distribution of the digital campaign over a network, irrespective of whether a request to execute the campaign includes broad or narrow specifications.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
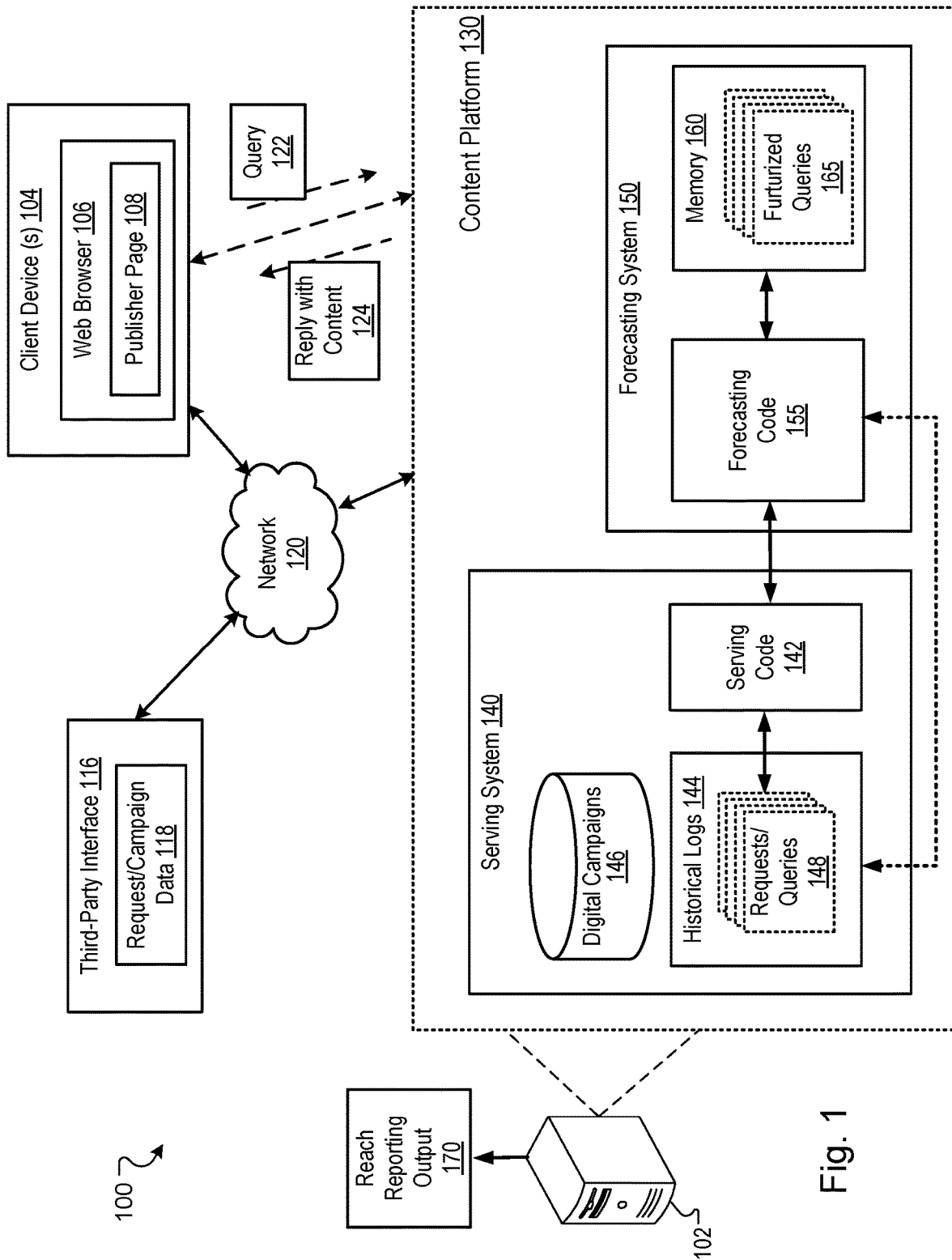
FIG. 1 shows an example computing system for forecasting performance of a digital campaign.

FIG. 1 shows an example computing system 100 for forecasting performance of a digital campaign. The system 100 generally includes a server 102, a client device 104, a third-party interface 116, a network 120, and a content platform 130.

In some implementations, system 100 and server 102 can include one or more processors, memory, and data storage devices (e.g., non-transitory storage devices) that collectively form the system 100. The processors of the system 100 and server 102 process instructions for execution by devices and components of the system, including instructions stored in the memory or on storage devices for performing operations/actions described in this document.

For example, execution of the stored instructions can cause performance of operations that are described in more detail below. In other implementations, multiple processors may be used, as appropriate, along with multiple memories and types of memory. For example, devices and components of both system 100 and server 102 may be connected with multiple other computing devices, with each device (e.g., a server bank, groups of servers, or a multi-processor system)

performing portions of the actions or operations associated with the processes or logical flows described in this specification.

In general, server 102 and other components of system 100 can be implemented, in part, by execution of program code in the form of an executable application, otherwise known as an "app," that can be launched or executed using a client or user device. Upon execution, the app can establish a data connection with server(s) of system 100 to transmit data signals to the server as well as receives data signals from the server.

A client device 104 is an electronic device capable of requesting and receiving resources over the network 120. Example client devices 104 include personal computers, mobile communication devices, and other devices that can send and receive data over a computer network. For example, client device 104 can be an assistant device or may include a virtual assistant application that coordinates sending and receiving portions of data via client device 104. In some implementations, client device 104 is a smart speaker, e.g., with an integrated display, that sends and receives data in response to voice commands from a user. In other implementations, client device 104 is an augmented reality/virtual reality (AR/VR) device or an example gaming console. Client device 104 typically can include a user application, such as a web browser 106, which can be used to display a publisher page 108. Native applications executed by the client device 104 can also facilitate the sending and receiving of data over network 120.

Network 120 can be a local area network (LAN), a wide area network (WAN), the Internet, or a combination thereof. The network 120 connects client devices 104, third-party interface 116, and content platform 130 of server 102. System 100 can include many different user/client devices 104 that can receive a variety of electronic documents that include different types of digital components (described below) transmitted by a content server of content platform 130.

An electronic document can be data that presents a set of content at a client device 104. For example, publisher page 106 can be an electronic document that is configured to receive and/or integrate one or more digital components for display at the client device 104. Examples of other electronic documents include webpages, word processing documents, portable document format (PDF) documents, images, videos, search results pages, and feed sources. Native applications (e.g., "apps"), such as applications installed on mobile, tablet, or desktop computing devices are also examples of electronic documents.

A publisher of a given electronic document can maintain a data source that is used to populate portions of the electronic document. An electronic document can include a tag or script that causes the client device 104 to request content from the data source when the given electronic document is processed (e.g., rendered or executed) by a client device 104. The client device 104 integrates the content obtained from the data source into the given electronic document to create a composite electronic document including the content obtained from the data source.

An electronic document can include a tag or script for obtaining a digital component. In these situations, the tag or script is executed by the client device 104 when the given electronic document is processed by the client device 104. Execution of a script causes the client device 104 to generate a request for digital components (referred to as a "request for content 122"), which is transmitted over the network 120 to content platform 130. The content platform 130 can use information in the request 122 to select one or more digital components that are provided in response (e.g., as a "reply 124") to the request for content 122.

Third-party interface 116 can be an example user/mobile computing device, client computer, or any combination of software, middleware, or related front-end components. Interface 116 is configured to exchange data communications with content platform 130. For example, the interface 116 can provide a campaign request 118 that includes details about a digital campaign that directs specialized content (e.g., digital components) to a set of users. The details can include a set of parameters, such as targeting and filtering requirements, that specify the type of content to be included in the campaign and the particular types of users to which the campaign is directed. In some implementations, the campaign request 118 describes or includes certain specialized content (e.g., digital components) to be included as part of the digital campaign.

A digital campaign can be a collection of ad/content groups (e.g., ads, keywords, and bids/eligibility values) that share a budget, have common or distinct location targeting, or have common or distinct themes. The digital campaign can be used to render organized content that indicates categories of products or services offered by a particular entity, such as a company or merchant. An ad group can contain one or more ads, such as digital components, which target a shared set of keywords.

A digital component can be a discrete unit of digital content or digital information (e.g., a video clip, audio clip, multimedia clip, image, text, or another unit of content). Digital components can be electronically stored in a physical memory device as a single file or a collection of files, and digital components can take the form of video files, audio files, multimedia files, image files, or text files and include advertising information, such that an advertisement is a type of digital component.

The phrase "digital component" can refer to a portion of digital content that is integrated in publisher page 108 and rendered to a user via client device 104. In some implementations, the digital content may be integrated in the publisher page 108 by way of an ad or content impression. For example, an impression corresponds to fetching ads or digital content from a source and rendering the content at publisher page 108. In some implementations, an impression is counted as one impression each time a digital content is fetched or viewed once by a user when integrated at publisher page 108.

The content platform 130 generates a reporting output 170 (described below) that may be received at the interface 116. The reporting output 170 can include data describing details about future execution of a digital campaign. For example, the reporting output 170 can include information about prospective performance of the digital campaign. The prospective performance can indicate a quantity of users to which the digital campaign will be directed during execution of the campaign using one or more systems of content platform 130.

The content platform 130 includes a serving system 140 and a forecasting system 150. The serving system 140 generally includes data for digital campaigns 146, and prior requests/queries 148 that relate to other digital campaigns which may have been previously executed by serving system 140. The historical logs 144 correspond to prior requests/queries 148 and can be provided as an output of the serving system 140. The serving system 140 can store, or have access to, data describing requirements, e.g., targeting or filtering requirements, of existing digital campaigns 146.

As described in more detail below, the data describing requirements can be stored or accessed as data structures of the content platform 130. The serving system 140 is configured to serve content of one or more digital campaigns 146, which can include a digital campaign indicated via a new campaign request 118. For example, the serving system 140 processes information in a user query against campaign requirements ("campaign data structures") that correspond to a given digital campaign.

The forecasting system 150 generally includes a forecasting code 155 and a memory 160 that stores sets of futurized queries 165 obtained from an example data processing pipeline. The data processing pipeline generates the sets of futurized queries using data obtained from historical logs 144 that is provided as an output of the serving system 140. The techniques described in this document can be used to implement an improved impression forecasting system 150 that is configured to generate forecasts or forecast outputs used to determine prospective performance of a digital campaign.

The forecasting system 150 is configured to load a futurized set of logged user queries (and/or requests) into memory 160. Each query or user query in a futurized set of logged user queries is loaded as a data structure in memory 160. When the content platform 130 receives a request 118 to schedule (or execute) a new digital campaign, the forecasting system 150 is configured to obtain all eligible queries for this new campaign using one or more sets of futurized queries 165. For example, the forecasting system 150 can obtain the eligible queries based on a measure of similarity between the request and the sets of futurized queries 165. The measure of similarity is determined by processing data in the request 118 against at least information in the futurized queries 165. In some examples, the request 118 is a forecast-request that seeks to determine performance of a digital campaign that is scheduled for execution at some future date. The forecasting system 150 determines the measure of similarity using an instruction set of the forecasting code 155 that is derived from the serving code 142.

Server 102 uses the content platform 130 to generate an example reporting output 170. The reporting output 170 can be a forecast output that includes data describing future execution of a digital campaign. The forecast output 170 can indicate an amount of reach and a particular eligibility (e.g., bid or price) at which a particular digital campaign will serve. For example, the forecast output 170 can indicate that a particular campaign will achieve 1000 impressions, for a particular user demographic, within two days of executing the campaign.

The reach for the digital campaign provides an indication of the number of users in a digital audience that actually received or interacted with content of the campaign. In some instances, the digital campaign seeks to provide directed content to a group of users in a digital audience that have a certain set of demographic characteristics (e.g., age and gender). In other instances, an administrator of multiple digital campaigns may want to know the respective reach and demographic breakdowns of the number of users that received content for each of the multiple campaigns.

The content platform 130 can execute computing processes to suggest or predict adjusted eligibility values or bid amounts based on data included in output forecasts generated by forecasting system 150. In some implementations, the predicted adjusted eligibility values enable content providers to more efficiently expend pecuniary resources to trigger transmission of digital components, e.g., to increase their probability of achieving a given outcome or monetary gain.

The eligibility value be can a pecuniary amount, such as a bid amount, an entity (e.g., a content or ads provider) will expend to transmit digital components of an ad campaign to achieve a desired conversion outcome. The conversion outcome may result in earning a certain target score or realizing some commercial/monetary gain. In some implementations, the conversion outcome is achieved when a user converts or purchases an item following interaction with digital components presented at client device 104.

Figure 2:
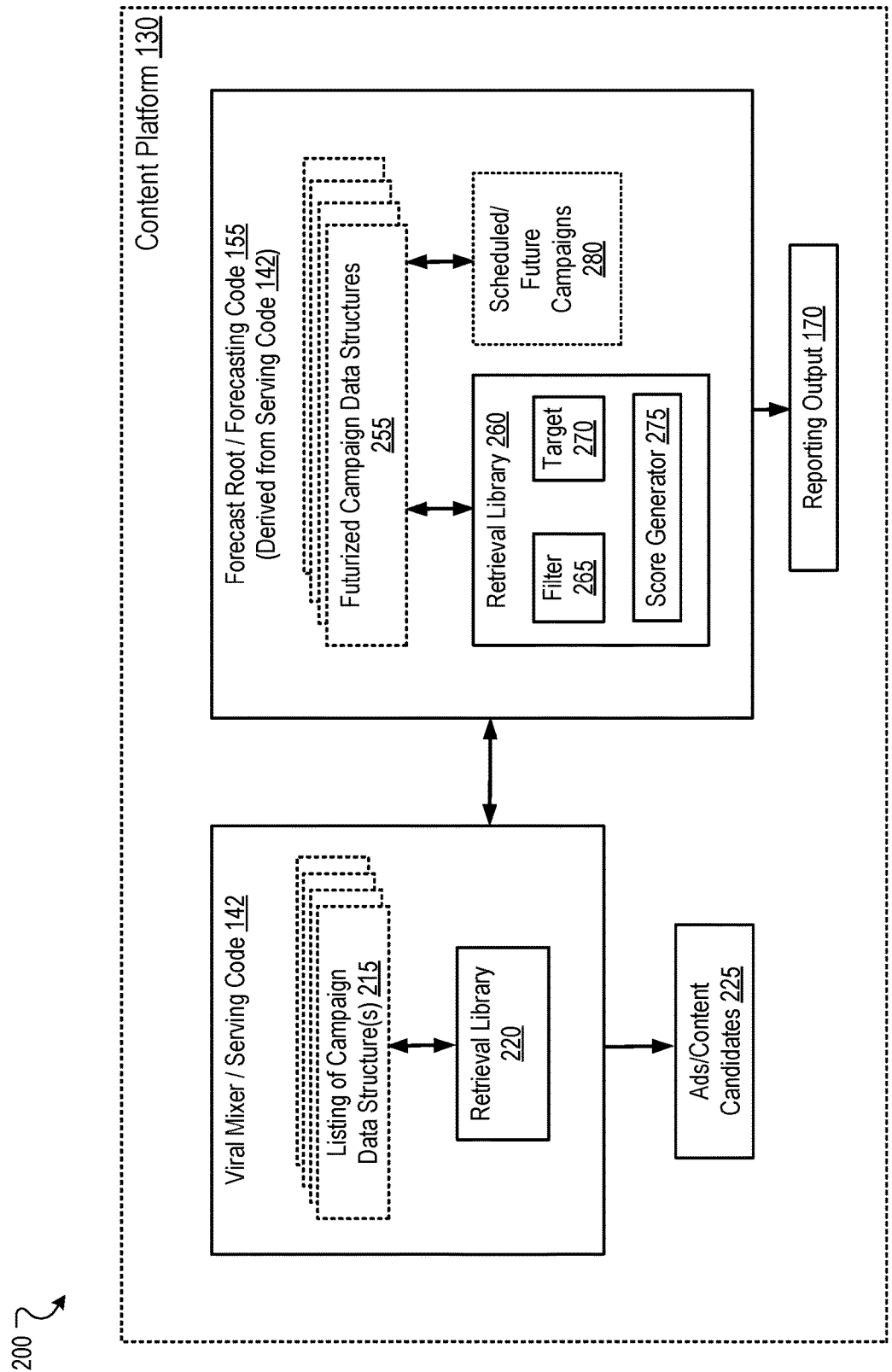
FIG. 2 shows functional blocks of example serving logic and example forecasting logic of a content platform of the computing system of FIG. 1.

FIG. 2 shows functional blocks 200 of example serving logic and example forecasting logic of the content platform 130. The functional blocks 200 indicate that the serving code 142 includes a retrieval library 220 that accesses a listing of campaign data structures 215 and performs operations to generate sets of ads/content candidates 225.

For example, the retrieval library 220 of the serving code 142 is configured to include a set of pre-defined reversible data structures for storing requirements in a request to execute a digital campaign. The data structures can also include information about user queries 122 that may be served specialized content (e.g., ads or digital components) of the campaign as a reply 124. The retrieval library 220 interacts with the listing of campaign data structures 215 to generate a set of ads candidates 225. The retrieval library 220 can perform filtering and targeting on sets of queries 122 using filtering and targeting requirements of a digital campaign (e.g., advertiser constraints), where the requirements are included in a request 118 to execute the digital campaign.

The functional blocks 200 also indicate that forecasting code 155 includes a listing of futurized campaign data structures 255 and a retrieval library 260 that interacts with the futurized campaign data structures 255 to generate a forecast/reporting output 170. The futurized campaign data structures 255 also interacts with sets of scheduled or future digital campaigns 280. The reporting output can include information for determining a prospective performance of a digital campaign of request 118, such as information indicating a quantity of users to which the digital campaign will be directed during actual, rather than forecasted, execution of the digital campaign by the serving system 140. The retrieval library 260 includes an instruction set that is derived from the serving code 142.

For example, using the sets of pre-defined reversible data structures included in the serving code 142, the forecasting system 150 derives instruction sets for performing forecasting operations in the same, or substantially the same, way that the serving system 140 performs its serving operations. The derived instruction set of the retrieval library 260 permits the forecasting system 150 to simulate, replicate, or otherwise emulate certain computing operations that are executed by the retrieval library 220 of the serving code 142. For example, the computing operations can be operations that are executed at the serving system 140 to transmit or serve digital components to client device 104 as reply 124 to a query 122.

The reversible (e.g., adaptable, adjustable, reusable, etc.) data structures of the serving code 142 are uniquely configured as logic structures within the serving code 142 to permit reversal and re-use within the forecasting code 155. For example, the serving code 142 is uniquely organized to enable its overall computing logic to be maintained as a retrieval library. The retrieval library is organized so that a serving representation of a digital campaign and corresponding retrieval logic is easily reversible for implementation at the forecasting system. In one implementation, a reversible data structure corresponds to a particular format or construct used for organizing, managing, or storing data in a manner that enables efficient access and processing of the data. For example, the data structure may be a particular type of data array, data tree, or data file that is adaptable for use by either the serving code 142 or the forecasting code 155.

The serving code 142, including its retrieval library can be organized or structured to have fewer (e.g., substantially fewer) global structures, relative to conventional structuring methods. The serving code 142 also does not use reverse-indexes that are built over existing digital campaigns. Such reverse-indexes can preclude effective re-use and implementation of the serving code by the forecasting system 150. In some implementations, per-campaign data structures are configured to be the same between the serving and forecasting systems 140, 150. This allows campaign data structures 215 to be easily reused by the forecasting code 155 to construct a per forecast-request campaign representation, e.g., for inclusion in the output 170.

The retrieval library 260 includes filtering logic 265, targeting logic 270, and a score generator 275. Filtering logic 265 can be configured to filter or remove queries from the set of futurized queries based on filtering constraints of the request 118. For example, a futurized query may indicate a user is a female located in the U.K., while a filtering constraint of the request 118 specifies that content be directed to males in Mountain View, Calif. Similarly, targeting logic 270 can be configured to obtain a particular set of futurized queries based on targeting requirements of the request 118. For example, a set of futurized queries may be generated with user information for males, age 18-25, that reside in large metropolitan cities based on targeting data about a particular set of users, where the targeting data is specified by the request 118. In some examples, a particular set of requirements can be implemented as either a targeting constraint, a filtering constraint, or a combination of each. For example, demographic information for a digital campaign can be mostly implemented as a targeting constraint using targeting logic 270, while a subset of the demographic information is implemented as a filtering constraint using filtering logic 265. One basic example of a filtering constraint can involve filtering logic 265 being used to determine that only digital components with data format X (e.g., JavaScript) are supported by a first user's device, while only digital components with data format Y (e.g., Dart) are supported by a second, different user's device.

The generated set of futurized queries can correspond to a targeting representation. For example, the forecasting system 150 is configured to generate a targeting representation of a digital campaign in response to processing information about the set of users in the request 118 (e.g., males, 18-25) against multiple futurized queries. The targeting representation is generated using targeting logic 270 in the instruction set of the forecasting system 150. In some implementations, the targeting logic 270 is derived from the set of pre-defined reversible data structures. In some implementations, the targeting representation can include an eligibility value that controls transmission of one or more digital components of the digital campaign indicated by request 118.

The score generator 275 is configured to generate scoring data, such as a similarity or match score, for each futurized query that is stored as one or more futurized campaign data structures 255. The scoring data can indicate a measure of similarity between targeting and filtering requirements included in a request 118 and user information for each respective futurized query. In some implementations, similarity between the request 118 and a futurized query, e.g., stored as futurized campaign data structures 255, is characterized by a respective match score (e.g., a score of 1.0) or respective similarity score (e.g., a score ranging from 0.6 to 0.9).

For example, the score generator 275 can generate a similarity score based on matching or substantially similar data items that exist between the request 118 and information in a futurized query. The matching or substantially similar data items can be the result of using filtering logic 265 and targeting logic 270 to compare filtering constraints and targeting requirements included in the request 118. In some cases, the score generator 275 generates a respective match score (1.0) to indicate exact matches between data in the request 118 and data included in each futurized query. For example, the filtering logic 265 can determine that the request 118 includes age-restricted content that is only appropriate for consumption by users that are at least 21 years. Filtering logic 265 can identify or determine whether user information in a futurized query indicates that the user is at least 21 years. In this instance, the score generator 275 generates a match of 1.0 for this discrete data item relating to age-restricted content because user data for the futurized query indicates the user satisfies the filtering constraint.

In other cases, the score generator 275 generates a respective similarity score (e.g., 0.8) to indicate similar, or substantially similar, correlations between data in the request 118 and data included in each futurized query. For example, the targeting logic 270 can determine that the request 118 has a targeting requirement of users that are 20-25 years old and interested in professional basketball. Targeting logic 270 can identify or determine that user information for a futurized query indicates that a user is at 25 years old and interested in college basketball, semi-pro basketball, or development basketball leagues that are affiliated with a professional basketball team. In this instance, the score generator 275 may generate an overall similarity score of 0.8 for these discrete data items because user data for the futurized query indicates the user only partially satisfies targeting requirements in the request 118. In some implementations, the score generator 275, as well as filtering and targeting logic 265, 275 are logical constructs which are shared between the serving code 142 and the forecasting code 155. For example, each of score generator 275, filtering logic 265, and targeting logic 275 can be configured to provide computing functions that are common between serving system 140 and forecasting system 150.

In some implementations, the content platform 130 uses an example log data extraction routine of the forecasting code 155 to obtain and load the futurized queries 165 in memory 160. Based on filtering and targeting logic 265, 270, the forecasting system 150 can extract ads/content query data from futurized campaign data structures 255 to build or generate a suitable futurized query file. The futurized query file can be generated when outputs of filtering and targeting logic 265, 270 are processed or scored by the forecasting system 150 using score generator 275. In some implementations, the futurized query file is generated by an offline computing process that analyzes the historical logs using seasonality logic to predict trends and/or data patterns for projecting data from the historical logs into the future. The futurized query file can be generated by the offline computing process without invoking retrieval logic of the serving code 142, thereby conserving resources of the serving code 142. In some implementations, the futurized query file represents ads or content query data which are stored using data structures that allow for fast or rapid Query data-to-Campaign matching when the forecasting system 150 is used to forecast how a particular campaign will perform when executed using serving system 140. In some cases, the futurized campaign data structures 255 interacts with various scheduled or future digital campaigns 280 to forecast how a particular campaign will perform with reference to the requirements of one or multiple campaigns 280 that have already been scheduled for execution, e.g., using serving system 140.

The forecasting system 150 can use a root-leaf architecture to store the Ad query data in RAM to allow for the fast query data to campaign matching. In some cases, futurized queries that correspond to this ad query data can be stored within multiple respective data shards in memory 160. Forecasting system 150 can populate a number of allocated impressions for a given request campaign based on computing outputs of filtering logic 265, targeting logic 270, and score generator 275.

Figure 3:
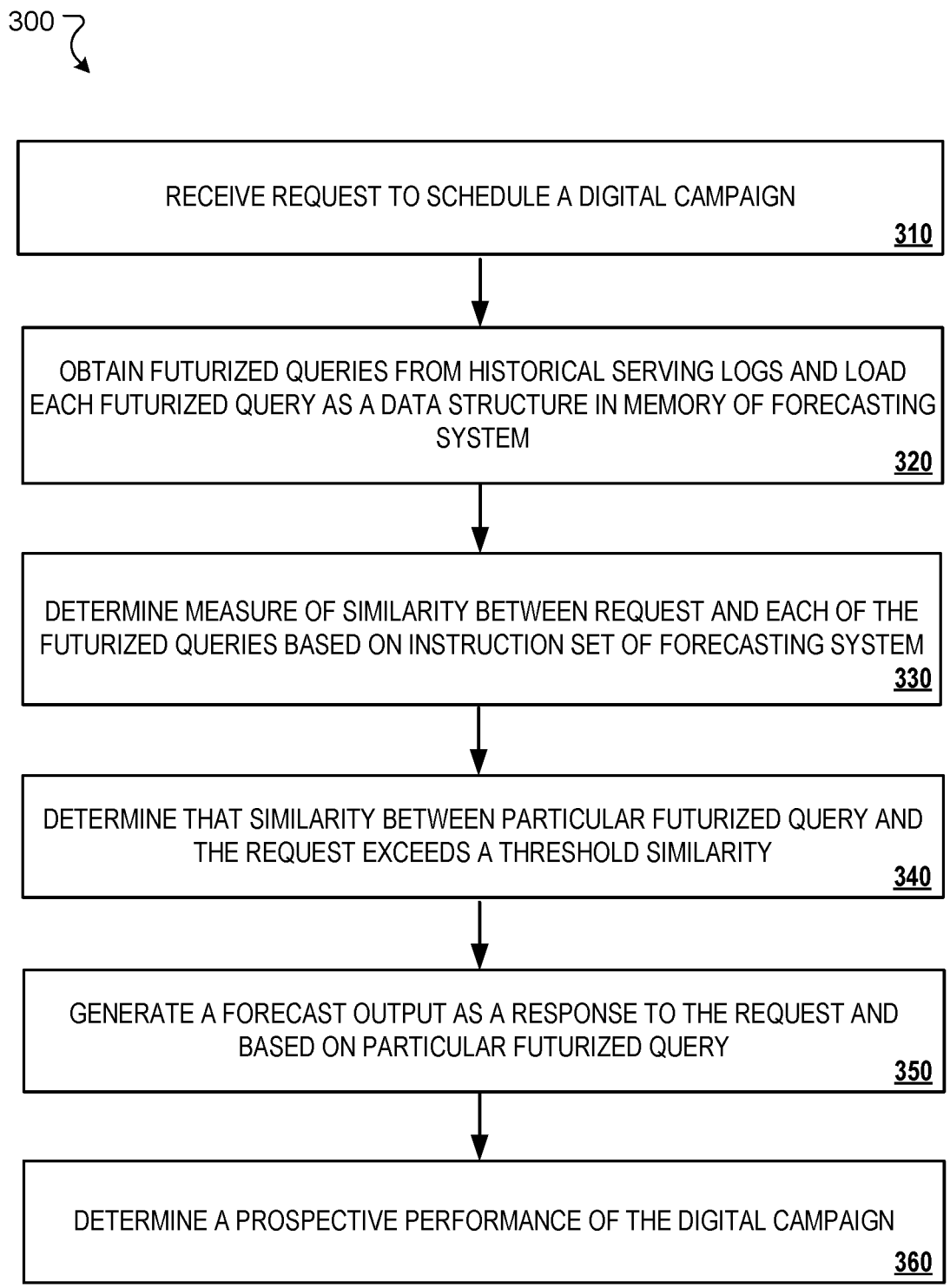
FIG. 3 shows an example process associated with forecasting performance of a digital campaign.

FIG. 3 shows an example process 300 associated with forecasting performance of a digital campaign. Process 300 can be implemented using one or more computing elements of system 100 described above as well as other components and instructions described in this document.

Process 300 includes the system 100 receiving a request to schedule a digital campaign (310). For example, the digital campaign can be scheduled for execution at some future date, as specified by the request. The request includes information about a set of users to which the digital campaign is directed. Based on the received request, the content platform 130 accesses or obtains data for requests 148 from historical serving logs 144 of the serving system 140. The obtained data can correspond to multiple futurized queries 165 or multiple sets of futurized queries 165. For each futurized query, the forecasting system 150 loads the futurized query as a data structure in the memory 160 of the forecasting system (320). For example, the forecasting system 150 can load the futurized queries 165 in memory 160 before (e.g., as a precompute step) any forecast-requests 118 are received at the forecasting system 150. In this manner, the forecasting system 150 can facilitate rapid processing of forecast-requests 118 by pre-loading sets of futurized queries 165 in memory 160. When the forecasting system 150 receives a forecast-request 118, the system 150 obtains or accesses data for the futurized queries 165 and proceeds to iterate the request over data elements of the futurized queries 165 to determine certain matches and similarities between the request 118 and the futurized queries 165.

As described above, the serving system 140 is configured to execute existing digital campaigns using serving code 142 that directs digital components of the existing digital campaigns to the set of users. For example, the serving system 140 can serve or transmit digital components that include sports related images and videos depicting prominent male and female athletes as reply 124. This reply can be responsive to a query 122 received at the content platform 130 from a client device 104 that is linked to a female between the age of 18 to 23 that is identified as being a current, or former, college athlete.

The forecasting system 150 determines, e.g., based on the iteration described above, a measure of similarity between the received request and at least the futurized query based on an instruction set of the forecasting system that is derived from the serving code (330). For example, forecasting system 150 can be configured log user query information, e.g., in the form of futurized user queries, from the serving system 140. The forecasting system 150 uses the logged information to determine a future set of events based on custom computing logic, such as the derived instruction set, that causes the system 150 to perform operations using data structures matching those used by the serving code 142.

For a particular futurized query, the forecasting system 150 determines that the measure of similarity indicates similarity between the futurized query and the request exceeds a threshold similarity (340). Forecasting system 150 uses the forecasting code 155 to determine that the futurized query and the request exceed the threshold similarity. In some implementations, the retrieval library 260 uses the score generator 275 to determine that similarity between respective futurized queries and the request exceeds a threshold similarity (e.g., indicated by 0.7 threshold similarity score). For example, as described above, the forecasting code 155 uses the score generator 275 to compute a similarity, or match, score based on outputs of the filtering or targeting logic 265, 270. These outputs indicate whether user information for a futurized query satisfies targeting or filtering constraints included in the request 118.

The forecasting system 150 generates a forecast output as a response to the request 118 and based on the particular futurized query (350). The forecast output includes data describing a future execution of the digital campaign and is used to determine prospective performance of the digital campaign. The forecasting system 150 determines a prospective performance of the digital campaign based on data values, such as user reach estimates or user demographics, which are included in the forecast output (360). The prospective performance indicates a quantity of users to which the digital campaign will be directed during execution of the digital campaign by the serving system 140. The forecasting system 150 is configured to forecast performance of a digital campaign indicated by the request 118 by using the same (e.g., substantially the same) data structures used by the serving system 140. In some implementations, the system 100 generates reach reporting output 170 using data values of the forecast output. The reporting output 170 can be provided for output at a display of a computing device, such as a laptop or tablet computing device. The reporting output 170 can be used to render prospective performance data of the digital campaign at the display of the computing device.

The forecasting system 150 can also analyze historical eligibility values or bid price values for a set of futurized queries to suggest an eligibility value for controlling transmission of ads content of a digital campaign as well as to determine an accurate forecast of the volume or reach for user queries that content of the campaign can be transmitted as a reply to. For example, the forecasting code 155 can scan the futurized campaign data structures 255 to identify various values, or bids for clicks, that other content managers have used to control transmission of their content or that content managers have previously expended (e.g., paid) to cause users to interact with digital components of their campaign.

Figure 4:
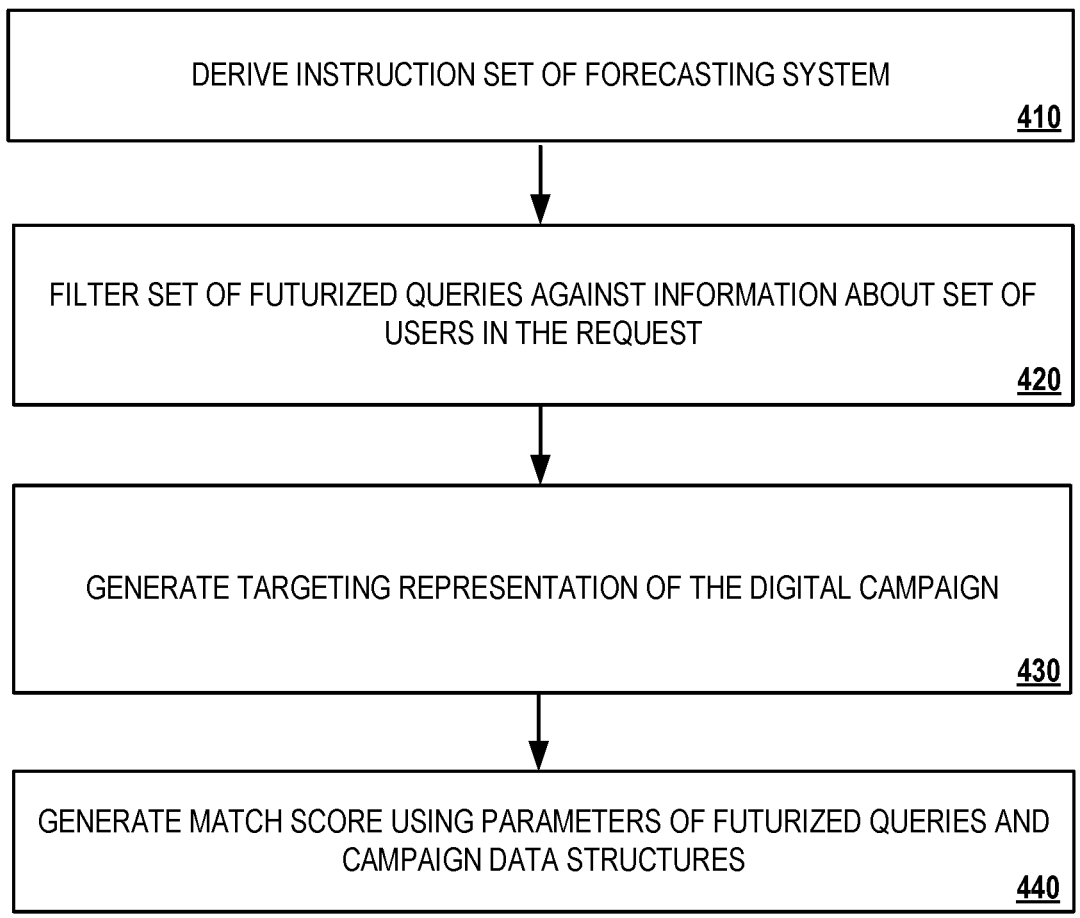
FIG. 4 shows another example process associated with forecasting performance of a digital campaign.

FIG. 4 shows another example process 400 associated with forecasting performance of a digital campaign. Process 400 can be implemented using one or more computing elements of system 100 described above as well as other components and instructions described in this document.

Process 400 includes the content platform 130 deriving an instruction set of the forecasting system (410). The serving code 142 of the serving system 140 can include a set of pre-defined reversible data structures. The forecasting system 150 uses the set of reversible data structures included in serving code 142.

The forecasting system 150 filters multiple futurized queries against information about the set of users in the request based on filtering constraints specified by the request (420). The multiple futurized queries are filtered using a filtering logic in the instruction set of the forecasting system 150 and filtering constraints of the request 118. The filtering logic can be derived from the set of pre-defined reversible data structures that match data structures of the serving system 140.

For example, a targeting requirement may specify that content of the digital campaign must be directed toward user queries 122 for males that are between 18 to 25 years old and reside in the U.S. However, a filtering requirement may specify that the content to be directed to the user queries 122 contains data items relating to alcohol and profanity. In this example, the serving system 150 would filter out queries 122 that indicate the source of the query is a user that is between 18 to 20 years old, and below the legal age for alcohol consumption.

The forecasting system 150 generates a targeting representation of the digital campaign in response to processing information about the set of users in the request 118 against the multiple futurized queries (430). In some implementations, the targeting representation is generated using a targeting logic in the instruction set of the forecasting system 150 and based on targeting requirements specified by the request 118. The targeting logic can be derived from the set of pre-defined reversible data structures that match data structures of the serving system 140.

The targeting representation of the digital campaign can include information describing a demographic attribute of the quantity of users, a geographic region that includes the quantity of users, and a timeframe for executing the digital campaign. In some implementations, the targeting representation of the digital campaign includes an eligibility value that controls transmission of one or more digital components of the digital campaign.

The forecasting system 150 generates a respective match score based on a determined measure of similarity for a query (440). In some implementations, a measure of similarity between the request and each respective futurized query is characterized by a respective match score. A respective similarity or match score can be generated for each futurized query that is obtained using data from the historical serving logs 144. In some cases, the score generator 275 generates a respective match score to indicate exact matches between data in the request 118 and data included in each futurized query. For example, a respective similarity score can indicate a substantial correlation between multiple first parameters of the request 118 and multiple second parameters of a particular futurized query obtained from the historical serving logs.

Figure 5:
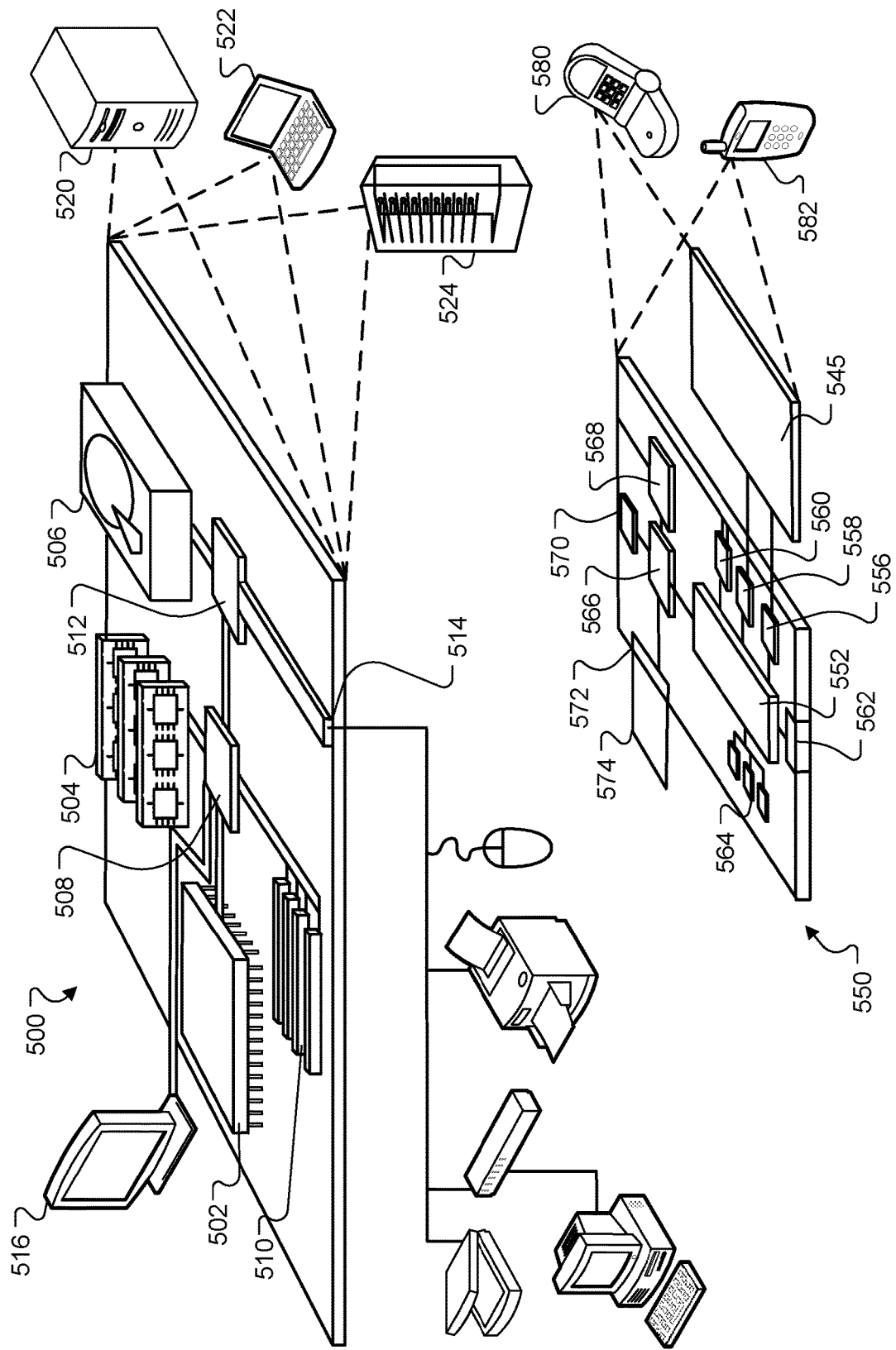
FIG. 5 shows a block diagram of an example computing system that can be used in connection with computer-implemented methods described in this specification.

FIG. 5 is a block diagram of computing devices 500, 550 that may be used to implement the systems and methods described in this document, as either a client or as a server or plurality of servers. Computing device 500 is intended to represent various forms of digital computers, such as laptops, desktops, workstations, personal digital assistants, servers, blade servers, mainframes, and other appropriate computers. Computing device 550 is intended to represent various forms of mobile devices, such as personal digital assistants, cellular telephones, smartphones, smartwatches, head-worn devices, and other similar computing devices. The components shown here, their connections and relationships, and their functions, are meant to be exemplary only, and are not meant to limit implementations described and/or claimed in this document.

Computing device 500 includes a processor 502, memory 504, a storage device 506, a high-speed interface 508 connecting to memory 504 and high-speed expansion ports 510, and a low speed interface 512 connecting to low speed bus 514 and storage device 506. Each of the components 502, 504, 506, 508, 510, and 512, are interconnected using various busses, and may be mounted on a common motherboard or in other manners as appropriate. The processor 502 can process instructions for execution within the computing device 500, including instructions stored in the memory 504 or on the storage device 506 to display graphical information for a GUI on an external input/output device, such as display 516 coupled to high speed interface 508. In other implementations, multiple processors and/or multiple buses may be used, as appropriate, along with multiple memories and types of memory. Also, multiple computing devices 500 may be connected, with each device providing portions of the necessary operations, e.g., as a server bank, a group of blade servers, or a multi-processor system.

The memory 504 stores information within the computing device 500. In one implementation, the memory 504 is a computer-readable medium. In one implementation, the memory 504 is a volatile memory unit or units. In another implementation, the memory 504 is a non-volatile memory unit or units.

The storage device 506 is capable of providing mass storage for the computing device 500. In one implementation, the storage device 506 is a computer-readable medium. In various different implementations, the storage device 506 may be a floppy disk device, a hard disk device, an optical disk device, or a tape device, a flash memory or other similar solid state memory device, or an array of devices, including devices in a storage area network or other configurations. In one implementation, a computer program product is tangibly embodied in an information carrier. The computer program product contains instructions that, when executed, perform one or more methods, such as those described above. The information carrier is a computer- or machine-readable medium, such as the memory 504, the storage device 506, or memory on processor 502.

The high speed controller 508 manages bandwidth-intensive operations for the computing device 500, while the low speed controller 512 manages lower bandwidth-intensive operations. Such allocation of duties is exemplary only. In one implementation, the high-speed controller 508 is coupled to memory 504, display 516, e.g., through a graphics processor or accelerator, and to high-speed expansion ports 510, which may accept various expansion cards (not shown). In the implementation, low-speed controller 512 is coupled to storage device 506 and low-speed expansion port 514. The low-speed expansion port, which may include various communication ports, e.g., USB, Bluetooth, Ethernet, wireless Ethernet, may be coupled to one or more input/output devices, such as a keyboard, a pointing device, a scanner, or a networking device such as a switch or router, e.g., through a network adapter.

The computing device 500 may be implemented in a number of different forms, as shown in the figure. For example, it may be implemented as a standard server 520, or multiple times in a group of such servers. It may also be implemented as part of a rack server system 524. In addition, it may be implemented in a personal computer such as a laptop computer 522. Alternatively, components from computing device 500 may be combined with other components in a mobile device (not shown), such as device 550. Each of such devices may contain one or more of computing device 500, 550, and an entire system may be made up of multiple computing devices 500, 550 communicating with each other.

Computing device 550 includes a processor 552, memory 564, an input/output device such as a display 554, a communication interface 566, and a transceiver 568, among other components. The device 550 may also be provided with a storage device, such as a microdrive or other device, to provide additional storage. Each of the components 550, 552, 564, 554, 566, and 568, are interconnected using various buses, and several of the components may be mounted on a common motherboard or in other manners as appropriate.

The processor 552 can process instructions for execution within the computing device 550, including instructions stored in the memory 564. The processor may also include separate analog and digital processors. The processor may provide, for example, for coordination of the other components of the device 550, such as control of user interfaces, applications run by device 550, and wireless communication by device 550.

Processor 552 may communicate with a user through control interface 558 and display interface 556 coupled to a display 554. The display 554 may be, for example, a TFT LCD display or an OLED display, or other appropriate display technology. The display interface 556 may include appropriate circuitry for driving the display 554 to present graphical and other information to a user. The control interface 558 may receive commands from a user and convert them for submission to the processor 552. In addition, an external interface 562 may be provided in communication with processor 552, so as to enable near area communication of device 550 with other devices. External interface 562 may provide, for example, for wired communication, e.g., via a docking procedure, or for wireless communication, e.g., via Bluetooth or other such technologies.

The memory 564 stores information within the computing device 550. In one implementation, the memory 564 is a computer-readable medium. In one implementation, the memory 564 is a volatile memory unit or units. In another implementation, the memory 564 is a non-volatile memory unit or units. Expansion memory 574 may also be provided and connected to device 550 through expansion interface 572, which may include, for example, a SIMM card interface. Such expansion memory 574 may provide extra storage space for device 550, or may also store applications or other information for device 550. Specifically, expansion memory 574 may include instructions to carry out or supplement the processes described above, and may include secure information also. Thus, for example, expansion memory 574 may be provided as a security module for device 550, and may be programmed with instructions that permit secure use of device 550. In addition, secure applications may be provided via the SIMM cards, along with additional information, such as placing identifying information on the SIMM card in a non-hackable manner.

The memory may include for example, flash memory and/or MRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 564, expansion memory 574, or memory on processor 552.

Device 550 may communicate wirelessly through communication interface 566, which may include digital signal processing circuitry where necessary. Communication interface 566 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 568. In addition, short-range communication may occur, such as using a Bluetooth, WiFi, or other such transceiver (not shown). In addition, GPS receiver module 570 may provide additional wireless data to device 550, which may be used as appropriate by applications running on device 550.

Device 550 may also communicate audibly using audio codec 560, which may receive spoken information from a user and convert it to usable digital information. Audio codec 560 may likewise generate audible sound for a user, such as through a speaker, e.g., in a handset of device 550. Such sound may include sound from voice telephone calls, may include recorded sound, e.g., voice messages, music files, etc., and may also include sound generated by applications operating on device 550.

The computing device 550 may be implemented in a number of different forms, as shown in the figure. For example, it may be implemented as a cellular telephone 580. It may also be implemented as part of a smartphone 582, personal digital assistant, or other similar mobile device.

Various implementations of the systems and techniques described here can be realized in digital electronic circuitry, integrated circuitry, specially designed ASICs, computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs, also known as programs, software, software applications or code, include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device, e.g., magnetic discs, optical disks, memory, Programmable Logic Devices (PLDs) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The systems and techniques described here can be implemented in a computing system that includes a back-end component, e.g., as a data server, or that includes a middleware component such as an application server, or that includes a front-end component such as a client computer having a graphical user interface or a Web browser through which a user can interact with an implementation of the systems and techniques described here, or any combination of such back-end, middleware, or front-end components. The components of the system can be interconnected by any form or medium of digital data communication such as, a communication network. Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

In addition, certain data may be treated in one or more ways before it is stored or used, so that personally identifiable information is removed. For example, in some embodiments, a user's identity may be treated so that no personally identifiable information can be determined for the user, or a user's geographic location may be generalized where location information is obtained (such as to a city, ZIP code, or state level), so that a particular location of a user cannot be determined. Thus, the user may have control over what information is collected about the user, how that information is used, and what information is provided to the user.

A number of embodiments have been described. Nevertheless, it will be understood that various modifications may be made without departing from the spirit and scope of the invention. Accordingly, other embodiments are within the scope of the following claims. While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, some processes depicted in the accompanying figures do not necessarily require the particular order shown, or sequential order, to achieve desirable results.

What is claimed is:

1. A computer-implemented method, comprising:
   receiving a request to provide a digital component to a set of users, wherein the request includes information about the set of users to which the digital components is directed;
   obtaining, based on the received request, a plurality of futurized queries from historical serving logs of a serving system that is configured to provide an existing digital component using serving code that directs the existing digital component to the set of users;
   for each futurized query of the plurality of futurized queries:
      loading the futurized query as a data structure in a memory of the forecasting system;
      determining, by a forecasting system, a measure of similarity between the request and at least the futurized query based on an instruction set of the forecasting system that is derived from the serving code; and
   determining, for a particular futurized query, that the measure of similarity indicates similarity between the particular futurized query and the request exceeds a threshold similarity;
   generating, by the forecasting system and based on the particular futurized query, a forecast output as a response to the request, wherein the forecast output includes data describing future provision of the digital component; and
   determining a quantity of users to which the digital component will be directed by the serving system.

2. The method of claim 1, wherein determining a quantity of users to which the digital component will be directed comprises:
   determining the quantity of users to which the digital component will be directed based on a quantity of particular futurized queries for which a respective measure of similarity indicates similarity between each of the particular futurized queries and the request exceeds a threshold similarity.

3. The method of claim 1, wherein serving code of the serving system includes a set of pre-defined reversible data structures and the method further comprises:
   deriving the instruction set of the forecasting system using the set of pre-defined reversible data structures included in the serving code of the serving system.

4. The method of claim 3, wherein the method further comprises:
   filtering the plurality of futurized queries against information about the set of users in the request, wherein the plurality of futurized queries is filtered using a filtering logic in the instruction set of the forecasting system, the filtering logic being derived from the set of pre-defined reversible data structures.

5. The method of claim 4, wherein the method further comprises:
   generating a targeting representation of the digital component in response to processing information about the set of users in the request against the plurality of futurized queries, wherein the targeting representation is generated using a targeting logic in the instruction set of the forecasting system, the targeting logic being derived from the set of pre-defined reversible data structures.

6. The method of claim 5, wherein the targeting representation of the digital component comprises information describing a demographic attribute of the quantity of users, geographic region that includes the quantity of users, and a timeframe for providing the digital component.

7. The method of claim 5, wherein the targeting representation of the digital component comprises an eligibility value that controls transmission of the digital component.

8. The method of claim 5, wherein:
i) the set of pre-defined reversible data structures is configured to provide filtering functions of the serving system; and
ii) the filtering logic of the forecasting system is configured to emulate, at the forecasting system, filtering functions performed by the serving system when the serving system serves the digital component.

9. The method of claim 8, wherein:
i) the set of pre-defined reversible data structures is configured to provide targeting functions of the serving system; and
ii) the targeting logic of the forecasting system is configured to emulate, at the forecasting system, targeting functions performed by the serving system when the serving system serves the digital component.

10. The method of claim 1, wherein the method further comprises:
generating, by the forecasting system, a respective similarity score based on the determined measure of similarity for each futurized query, wherein the respective similarity score is generated for each futurized query obtained from the historical serving logs.

11. The method of claim 10, wherein the respective similarity score indicates a match between a plurality of first parameters of the request and a plurality of second parameters of the particular futurized query obtained from the historical serving logs.

12. A system comprising:
one or more processing devices; and
one or more non-transitory machine-readable storage devices storing instructions that are executable by the one or more processing devices to cause performance of operations comprising:
receiving a request to provide a digital component to a set of users, wherein the request includes information about the set of users to which the digital component is directed;
obtaining, based on the received request, a plurality of futurized queries from historical serving logs of a serving system that is configured to provide an existing digital component using serving code that directs the existing digital component to the set of users;
for each futurized query of the plurality of futurized queries:
loading the futurized query as a data structure in a memory of the forecasting system;
determining, by a forecasting system, a measure of similarity between the request and at least the futurized query based on an instruction set of the forecasting system that is derived from the serving code; and
determining, for a particular futurized query, that the measure of similarity indicates similarity between the particular futurized query and the request exceeds a threshold similarity;
generating, by the forecasting system and based on the particular futurized query, a forecast output as a response to the request, wherein the forecast output includes data describing future provision of the digital component; and
determining a quantity of users to which the digital component will be directed by the serving system.

13. The system of claim 12, wherein determining a quantity of users to which the digital component will be directed comprises:
determining the quantity of users to which the digital component will be directed, based on a quantity of particular futurized queries for which a respective measure of similarity indicates similarity between each of the particular futurized queries and the request exceeds a threshold similarity.

14. The system of claim 12, wherein serving code of the serving system includes a set of pre-defined reversible data structures and the operations further comprise:
deriving the instruction set of the forecasting system using the set of pre-defined reversible data structures included in the serving code of the serving system.

15. The system of claim 14, wherein the operations further comprise:
filtering the plurality of futurized queries against information about the set of users in the request, wherein the plurality of futurized queries is filtered using a filtering logic in the instruction set of the forecasting system, the filtering logic being derived from the set of pre-defined reversible data structures.

16. The system of claim 15, wherein the operations further comprise:
generating a targeting representation of the digital component in response to processing information about the set of users in the request against the plurality of futurized queries, wherein the targeting representation is generated using a targeting logic in the instruction set of the forecasting system, the targeting logic being derived from the set of pre-defined reversible data structures.

17. The system of claim 16, wherein the targeting representation of the digital component comprises information describing a demographic attribute of the quantity of users, geographic region that includes the quantity of users, and a timeframe for providing the digital component.

18. The system of claim 16, wherein the targeting representation of the digital component comprises an eligibility value that controls transmission of the digital component.

19. The system of claim 16, wherein:
i) the set of pre-defined reversible data structures is configured to provide filtering functions of the serving system; and
ii) the filtering logic of the forecasting system is configured to emulate, at the forecasting system, filtering functions performed by the serving system when the serving system provides the digital component.

20. The system of claim 19, wherein:
i) the set of pre-defined reversible data structures is configured to provide targeting functions of the serving system; and
ii) the targeting logic of the forecasting system is configured to emulate, at the forecasting system, targeting functions performed by the serving system when the serving system provides the digital component.

21. The system of claim 12, wherein the operations further comprise:
generating, by the forecasting system, a respective similarity score based on the determined measure of similarity for each futurized query, wherein the respective similarity score is generated for each futurized query obtained from the historical serving logs.

22. The system of claim 21, wherein the respective similarity score indicates a match between a plurality of first parameters of the request and a plurality of second parameters of the particular futurized query obtained from the historical serving logs.

23. One or more non-transitory machine-readable storage devices storing instructions that are executable by one or more processing devices to cause performance of operations comprising:
receiving a request to provide a digital component, wherein the request includes information about a set of users to which the digital component is directed;
obtaining, based on the received request, a plurality of futurized queries from historical serving logs of a serving system that is configured to provide an existing digital component using serving code that directs the existing digital component to the set of users;
for each futurized query of the plurality of futurized queries:
loading the futurized query as a data structure in a memory of the forecasting system;
determining, by a forecasting system, a measure of similarity between the request and at least the futurized query based on an instruction set of the forecasting system that is derived from the serving code; and
determining, for a particular futurized query, that the measure of similarity indicates similarity between the particular futurized query and the request exceeds a threshold similarity;
generating, by the forecasting system and based on the particular futurized query, a forecast output as a response to the request, wherein the forecast output includes data describing future provision of the digital component; and
determining a quantity of users to which the digital component will be directed by the serving system.

* * * * *